(12) United States Patent
Chen et al.

(10) Patent No.: US 11,233,218 B2
(45) Date of Patent: Jan. 25, 2022

(54) DISPLAY PANEL INCLUDING OPPOSITELY ARRANGING THE DISPLAY SUBSTRATE AND THE PACKAGING COVER PLATE TO FORM A CELL AND METHOD FOR PACKAGING THE SAME, AND DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Chao Chen, Beijing (CN); Dongxi Li, Beijing (CN); Jinfeng Chen, Beijing (CN); Yifeng Su, Beijing (CN); Xiaoli Kong, Beijing (CN); Weiming Yu, Beijing (CN); Qianglong Li, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/523,290

(22) Filed: Jul. 26, 2019

(65) Prior Publication Data
US 2020/0185642 A1  Jun. 11, 2020

(30) Foreign Application Priority Data
Dec. 5, 2018  (CN) .......................... 201811481313.8

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01)

(58) Field of Classification Search
CPC ..... H01L 51/5246; H01L 51/56; H01L 51/52; H01L 51/524; H01L 51/525
(Continued)

(56) References Cited

U.S. PATENT DOCUMENTS

2007/0190675 A1* 8/2007 Yamazaki ............. H01J 9/2275
438/22
2015/0123106 A1* 5/2015 Yasumoto ............. H01L 51/003
257/40
(Continued)

FOREIGN PATENT DOCUMENTS

| CN | 104821139 A | 8/2015 |
|---|---|---|
| JP | S62108495 A | 5/1987 |
| JP | S62160692 A | 7/1987 |

OTHER PUBLICATIONS

Second Office Action for Chinese Application No. 201811481313.8, dated Aug. 3, 2020, 6 Pages.

*Primary Examiner* — Alexander O Williams
(74) *Attorney, Agent, or Firm* — Brooks Kushman P.C.

(57) ABSTRACT

A display panel, comprising a display substrate and a packaging cover plate that are oppositely arranged to form a cell, in which the packaging cover plate comprises a cover plate substrate, an air cushion layer formed on the cover plate substrate, and an packaging layer covering the air cushion layer and having a first concave structure, the display substrate comprises a base substrate and a display component formed on the base substrate and embedded in the first concave structure.

7 Claims, 8 Drawing Sheets

(58) Field of Classification Search
USPC .......................................................... 257/729
See application file for complete search history.

(56) References Cited

U.S. PATENT DOCUMENTS

2015/0223297 A1    8/2015  Sato
2016/0155988 A1\*  6/2016  Kuroki ................ H01L 51/5268
                                              257/40

\* cited by examiner

DISPLAY PANEL INCLUDING OPPOSITELY ARRANGING THE DISPLAY SUBSTRATE AND THE PACKAGING COVER PLATE TO FORM A CELL AND METHOD FOR PACKAGING THE SAME, AND DISPLAY DEVICE

CROSS-REFERENCE TO RELATED APPLICATION

This application claims priority to Chinese Patent Application No. 201811481313.8 filed on Dec. 5, 2018, which is incorporated herein by reference in its entirety.

TECHNICAL FIELD

The embodiments of the present disclosure relate to the field of display technology, in particular to a display panel and a method for packaging the same, and a display device.

BACKGROUND

The organic light-emitting material in the organic light-emitting diode (OLED) display component is extremely sensitive to water and oxygen. After the organic light-emitting material is in contact with water and oxygen, the light-emitting effect of the organic light-emitting material is affected, thereby affecting the quality and the service life of the OLED display component. Therefore, the packaging of the display component is crucial.

In the related art, a packaging layer covering a display component is usually formed on a display component of a display substrate, a glass cover plate and the display substrate are oppositely arranged to form a cell, and all contact portions between the packaging layer and the display base substrate and all contact portions between the packaging layer and the glass cover plate is sintered by laser, to achieve a better packaging effect.

However, in the existing OLED display panel, the sintering area of the package is relatively large, and the heat and the water and oxygen released by a large-area sintering are more likely to adversely affect the display component.

SUMMARY

An embodiment of the present disclosure provides a display panel, comprising a display substrate and a packaging cover plate that are oppositely arranged to form a cell, wherein the packaging cover plate comprises a cover plate substrate, an air cushion layer formed on the cover plate substrate, and an packaging layer covering the air cushion layer and having a first concave structure; and the display substrate comprises a base substrate and a display component formed on the base substrate and embedded in the first concave structure.

Optionally, the packaging layer is sintered and fixed to the cover plate substrate.

Optionally, the packaging layer is sintered and fixed to the base substrate on the periphery of the display component.

Optionally, the air cushion layer has a second concave structure, an opening of which faces away from the cover plate substrate; the packaging layer comprises a barrier layer and a spacer layer; the barrier layer has a third concave structure and a fourth concave structure surrounding the third concave structure, with an opening direction of the fourth concave structure being opposite to an opening direction of the second concave structure, and with a convex edge of the second concave structure being embedded into the fourth concave structure; and the spacer layer is embedded in the third concave structure, and the spacer layer has the first concave structure.

Optionally, the barrier layer is sintered and fixed to the base substrate on the periphery of the display component.

Optionally, the display panel further comprises a sealant frame which is located between the display substrate and the packaging cover plate and is connected to the cover plate substrate and the base substrate on the periphery of the packaging layer.

Optionally, a material of the air cushion layer comprises a nitrogen gas and/or an inert gas.

Optionally, a material of the barrier layer comprises SiOx or a SiOx composite.

Optionally, a material of the spacer layer comprises SiNx and at least one of iron fine particles, calcium oxide fine particles and strontium oxide fine particles.

Optionally, a sintering area between the barrier layer and the base substrate is smaller than a contact area between the barrier layer and the base substrate.

In order to solve the above problems, an embodiment of the present disclosure further provides a method for packaging a display panel, comprising: providing a display substrate comprising a base substrate and a display component formed on the base substrate; preparing a packaging cover plate, comprising forming an air cushion layer and an packaging layer having a first concave structure on the cover plate substrate, wherein the air cushion layer is arranged proximate to the cover plate substrate, and the packaging layer covers the air cushion layer; sealing a contact portion between the packaging layer and the cover plate substrate; and oppositely arranging the display substrate and the packaging cover plate to form a cell, such that the display component is embedded in the first concave structure.

Optionally, the sealing the contact portion between the packaging layer and the cover plate substrate comprises: sintering the contact portion between the packaging layer and the cover plate substrate; or forming a sealant frame on the cover plate substrate on the periphery of the packaging layer.

Optionally, the packaging layer comprises a barrier layer and a spacer layer, and the forming the air cushion layer and the packaging layer having the first concave structure on the cover plate substrate comprises: arranging an air cushion layer mold having a fifth concave structure on the cover plate substrate in a chamber filled with a preset gas, to form an air cushion layer having a second concave structure, an opening of which faces away from the cover plate substrate between the cover plate substrate and the air cushion layer mold; forming the barrier layer to cover the air cushion layer mold, in which the barrier layer has a third concave structure and a fourth concave structure surrounding the third concave structure, with an opening direction of the fourth concave structure being opposite to an opening direction of the second concave structure, and with a convex edge of the second concave structure being embedded into the fourth concave structure; and forming the spacer layer having the first concave structure in the third concave structure.

Optionally, the air cushion layer mold is a cardboard mold, which remains in the packaging cover plate after the packaging cover plate is prepared; or an air cushion layer mold is prepared by forming soft plastics into a shape of the air cushion layer mold in a chamber filled with a preset gas, followed by curing.

Optionally, the air cushion layer is formed by a method similar to vacuum casting.

Optionally, the barrier layer is formed by an evaporation process or a sputtering process, with an acute angle formed between the cover plate substrate and an emission direction of an evaporation source or a sputtering source, and with the cover plate substrate rotating at a certain rate during the evaporation process or the sputtering process.

Optionally, after the arranging the display substrate and the packaging cover plate to form the cell, such that the display component is embedded in the first concave structure, the method further comprises: sintering the packaging layer and the base substrate on the periphery of the display component.

Optionally, the packaging layer comprises a barrier layer and a spacer layer, and the sintering the packaging layer and the base substrate on the periphery of the display component comprises: sintering the barrier layer and the base substrate on the periphery of the display component.

Optionally, after the cell is formed, a thermosetting adhesive or a UV-curable adhesive is further added to a contact portion between the sealant frame and the base substrate to fix them, such that the base substrate on the periphery of the sealing layer and the sealing frame are connected.

In order to solve the above problems, an embodiment of the present disclosure further provides a display device comprising the above display panel.

DESCRIPTION OF THE REFERENCE NUMBERS

10—display substrate, 11—base substrate, 12—display component, 20—packaging cover plate, 21—cover plate substrate, 22—air cushion layer, 221—second concave structure, 23—packaging layer, 231—barrier layer, 2311—third concave structure, 2312—fourth concave structure, 232—spacer layer, 2321—first concave structure, 30—sealant frame, 01—sintering point of base substrate, 02—sintering point of cover plate substrate, 03—preset gas, 04—air cushion layer mold, 041—fifth concave structure, 05—evaporation source or sputtering source.

DETAILED DESCRIPTION

In order to illustrate the above purposes, features and advantages in the embodiments of the present disclosure in a clear manner, a detailed description of the present disclosure will be further described in detail below in conjunction with the drawings and specific embodiments.

In an embodiment of the present disclosure, a packaging cover plate of a display panel comprises a cover plate substrate, an air cushion layer formed on the cover plate substrate, and a packaging layer covering the air cushion layer and having a first concave structure; and a display substrate of a display panel comprises a base substrate and a display component formed on the base substrate and embedded in the first concave structure. In the embodiment of the present disclosure, the air cushion layer can block most of the packaging layer from the cover plate substrate and reduce the contact area between the packaging layer and the cover plate substrate, and thus it is not necessary to sinter and fix the contact portion between the air cushion layer and the cover plate substrate. As such, it is possible to reduce the sintering area of the display panel, thereby reducing the amounts of heat and of water and oxygen released during the packaging process, and reducing the adverse effect of the laser sintering process on the display component.

Embodiment 1

Figure 1:
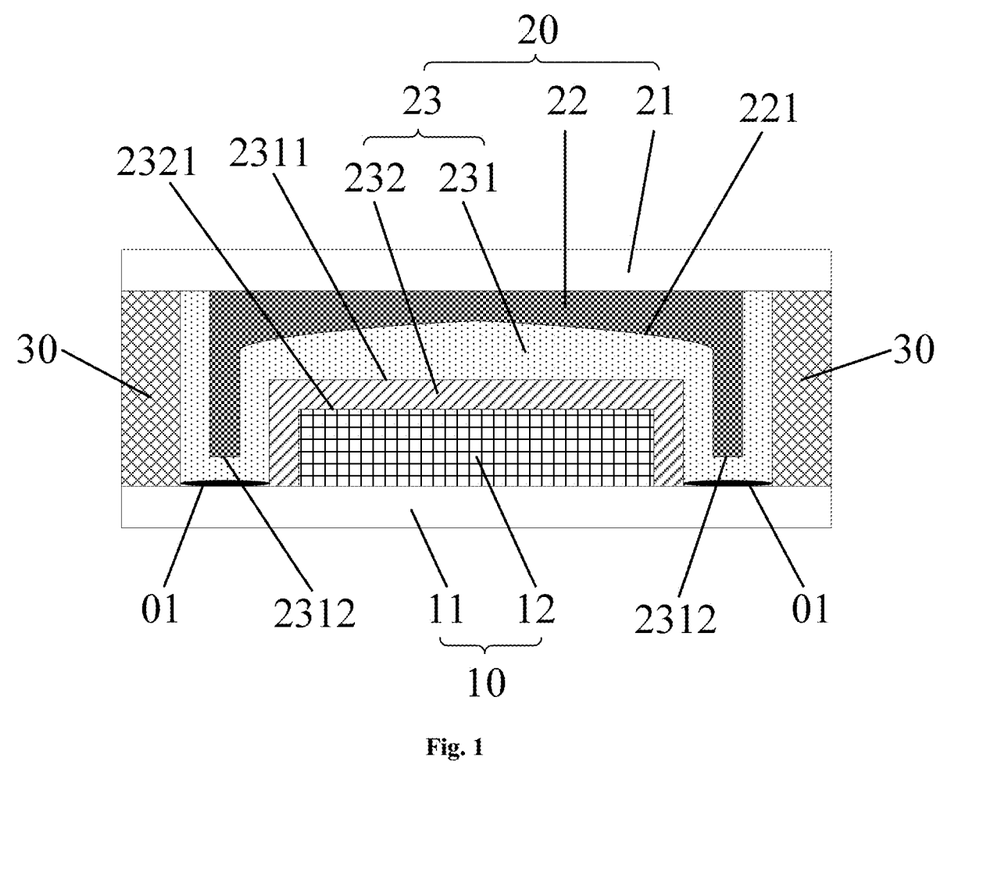
FIG. 1 is a schematic cross-sectional view showing a display panel according to some embodiments of the present disclosure.

FIG. 1 is a schematic cross-sectional view showing a display panel according to an embodiment of the present disclosure. Referring to FIG. 1, the display panel comprises a display substrate 10 and a packaging cover plate 20 that are oppositely arranged to form a cell. The packaging cover plate 20 comprises a cover plate substrate 21, an air cushion layer 22 formed on the cover plate substrate 21, and a packaging layer 23 covering the air cushion layer 22 and having a first concave structure 2321. The display substrate 10 comprises a base substrate 11 and a display component 12 formed on the base substrate 11 and embedded in the first concave structure 2321.

Specifically, as shown in FIG. 1, the air cushion layer 22 has a second concave structure 221, an opening of which faces away from the cover plate substrate 21. The packaging layer 23 comprises a barrier layer 231 and a spacer layer 232, in which the barrier layer 231 has a third concave structure 2311 embedded in the second concave structure 221 of the air cushion layer 22 and a fourth concave structure 2312 surrounding the third concave structure 2311, with an opening direction of the fourth concave structure 2312 being opposite to an opening direction of the second concave structure 221, and with a convex edge of the second concave structure 221 being embedded into the fourth concave structure 2312. In addition, the spacer layer 232 is embedded in the third concave structure 2311 of the barrier layer 231, the spacer layer 232 has a first concave structure 2321, and the display component 12 is embedded in the first concave structure 2321 of the spacer layer 232.

In the embodiment of the present disclosure, the air cushion layer 22 may be filled with some protection gases and/or drying gases, so that it is possible to block most of the barrier layer 231 from the cover plate substrate 21 and reduce the contact area between the barrier layer 231 and the cover plate substrate 21, and thus when the packaging is performed it is not necessary to sinter and fix the contact portion between the air cushion layer 22 and the cover plate substrate 21. As such, it is possible to reduce the sintering area of the display panel, thereby reducing the amounts of heat and of water and oxygen released during the packaging process, and reducing the adverse effect of the sintering process on the display component.

Further, the packaging layer 23 may be sintered and fixed to the base substrate on the periphery of the display component 12. For example, the packaging layer 23 may be sintered and fixed to the base substrate on the periphery of the display component 12 by a laser sintering process. Specifically, referring to FIG. 1, the barrier layer 231 and the base substrate on the periphery of the display component 12 may be sintered and fixed. The sintering point 01 of the base substrate is as shown in FIG. 1, that is, the barrier layer 231 in the packaging layer 23 is sintered and fixed to the base substrate 11, while the spacer layer 232 in the packaging layer 23 is not sintered and fixed to the base substrate 11. In this way, it is capable of further reducing the sintering area of the display panel, thereby reducing the amounts of heat and of water and oxygen released during the packaging process of the panel. Of course, the spacer layer 232 can also be sintered and fixed to the base substrate on the periphery of the display component 12, and this is not specifically limited in the embodiment of the present disclosure. The increased sintering area due to sintering spacer layer 232 is much smaller than the reduced sintering area due to arranging the air cushion layer 22.

In addition, in practical applications, the sintering area between the barrier layer 231 and the base substrate 11 may also be smaller than the contact area between the barrier layer 231 and the base substrate 11, that is, it is not necessary to sinter the entire contact portion between the barrier layer 231 and the base substrate 11. As such, the sintering area can be further reduced. However, the sintering area between the barrier layer 231 and the base substrate 11 is not limited thereto.

In addition to sintering and sealing the packaging layer 23 and the base substrate 11, it is also necessary to seal the contact portion between the packaging layer 23 and the cover plate substrate 21 in the packaging cover plate, to achieve a better packaging effect. In one embodiment, the contact portion between the packaging layer 23 and the cover plate substrate 21 may be sealed by a sealant frame 30. As shown in FIG. 1, the display panel further comprises a sealant frame 30 which is located between the display substrate 10 and the packaging cover plate 20 and is connected to the cover plate substrate 21 on the periphery of the packaging layer 23 and the base substrate 11. That is, the seal frame 30 can bond the base substrate 11 at the edge of the display panel and the cover plate substrate 21. As such, external water oxygen can be prevented from entering the gap between the packaging layer 23 and the cover plate substrate 21, and the gap between the packaging layer 23 and the base substrate 11, thereby preventing external water and oxygen from coming into contact with the internal display component.

Figure 2:
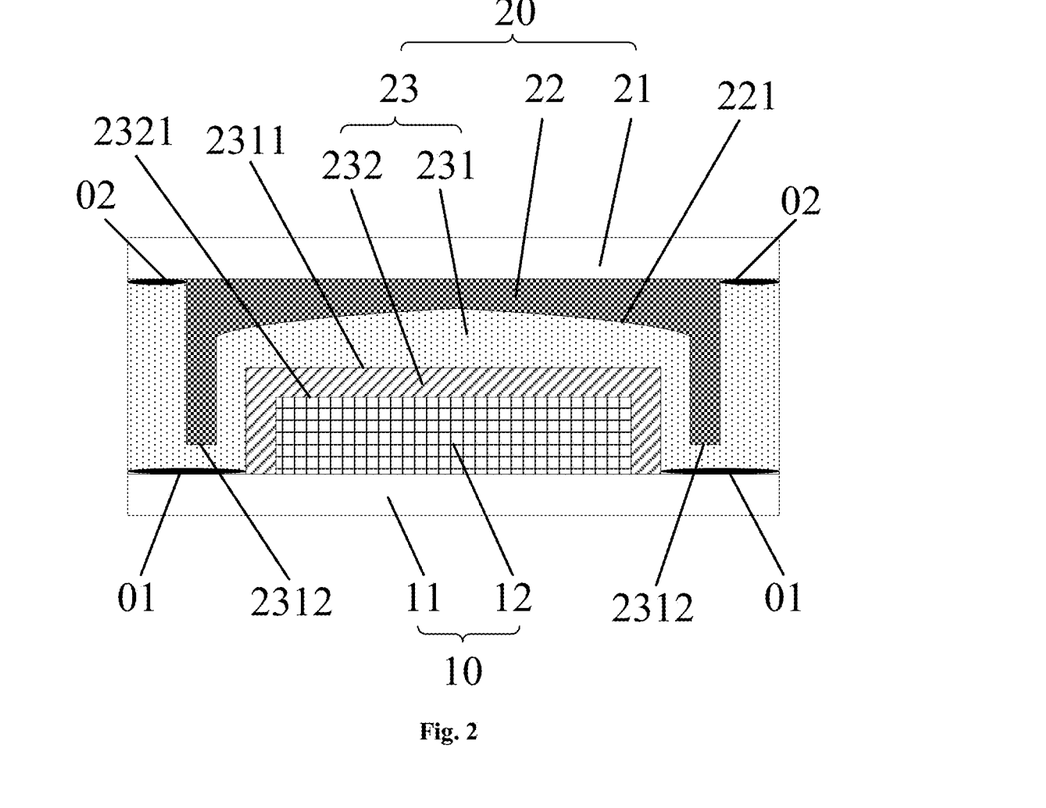
FIG. 2 is a schematic cross-sectional view showing another display panel according to some embodiments of the present disclosure.

In another embodiment, the contact portion between the packaging layer 23 and the cover plate substrate 21 may also be sealed by sintering. FIG. 2 is a schematic cross-sectional view showing another display panel. Referring to FIG. 2, the packaging layer 23 may be sintered and fixed to the cover plate substrate 21. Specifically, the contact portion between the barrier layer 231 in the packaging layer 23 and the cover plate substrate 21 can be sintered by laser, in which the position for the sintering point 02 of the cover plate substrate is as shown in FIG. 2. As such, it is not necessary to provide a seal frame on the edge of the display panel, which can simplify the packaging process. In addition, in order to achieve a better packaging effect, the area of the barrier layer 231 may be slightly increased, thereby increasing the contact area between the barrier layer 231 and the cover plate substrate 21, and correspondingly, the sintering area between the barrier layer 231 and the cover plate substrate 21 will also be increased, thereby ensuring a better packaging effect. The increased sintering area due to increasing the area of the barrier layer 231 is much smaller than the reduced sintering area due to arranging the air cushion layer 22.

The materials of the cover plate substrate 21 and the base substrate 11 may be glass.

The material of the air cushion layer 22 may comprise a nitrogen gas and/or an inert gas, for example, may comprise only nitrogen gas, comprise only helium gas, or comprise a mixture gas of nitrogen gas and helium gas. The air cushion layer 22 can not only reduce the sintering area between the packaging layer 23 and the cover plate substrate 21 by reducing the contact area thereof, but also reduce the deformation during the packaging process and in the subsequent use process because of its buffer effect during the packaging process and in the subsequent use process. In addition, the air cushion layer 22 can also apply pressure to the packaging layer 23, so that the packaging layer 23 is more closely adhered to the display component 12, thereby enhancing the airtightness.

The barrier layer 231 may be made of a sinterable low-melting amorphous material. For example, the material of the barrier layer 231 may comprise SiOx or a SiOx composite, in which the SiOx composite may be a composite mixed by SiOx and other metal oxides or other non-metal oxides.

The material of the spacer layer 232 may comprise SiNx and at least one of iron fine particles, calcium oxide fine particles and strontium oxide fine particles. For example, at least one of iron fine particles, calcium oxide fine particles and strontium oxide fine particles may be filled in the SiNx material. Among them, iron fine particles, calcium oxide fine particles and strontium oxide fine particles can be used as an antioxidant and a desiccant.

The material of the seal frame 30 may comprise a thermosetting adhesive or an ultraviolet (UV)-curable adhesive, in which the thermosetting adhesive is formed by mixing an epoxy resin, a catalyst and a catalyst solvent, is liquid at normal temperature, and can become solid after the heat curing. The UV curable adhesive is formed by mixing an acrylic resin, a UV initiator, etc., is liquid at normal temperature, and can become solid after the UV curing.

In an embodiment of the present disclosure, a packaging cover plate of a display panel comprises a cover plate substrate, an air cushion layer formed on the cover plate substrate, and a packaging layer covering the air cushion layer and having a first concave structure; and a display substrate of a display panel comprises a base substrate and a display component formed on the base substrate and embedded in the first concave structure. In the embodiment of the present disclosure, the air cushion layer can block most of the packaging layer from the cover plate substrate, and reduce the contact area between the packaging layer and the cover plate substrate, and thus it is not necessary to sinter and fix the contact portion between the air cushion layer and the cover plate substrate. As such, it is capable of reducing the sintering area of the display panel, thereby reducing the amounts of heat and of water and oxygen released during the packaging process, and reducing the adverse effect of the sintering process on the display component.

Embodiment 2

Figure 3:
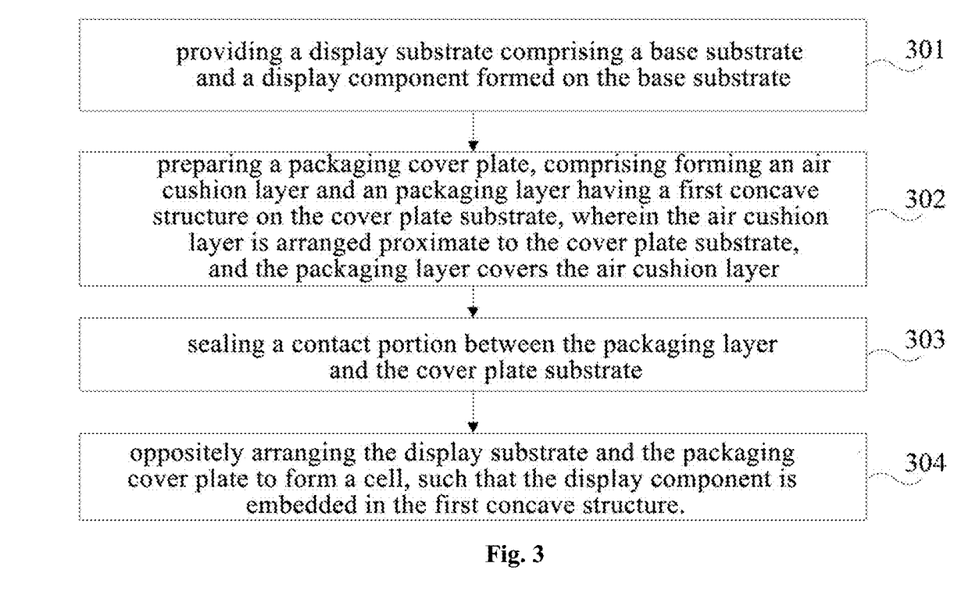
FIG. 3 is a flow chart showing a method for packaging a display panel according to some embodiments of the present disclosure.

FIG. 3 is a flow chart showing a method for packaging a display panel according to Embodiment 2 of the present disclosure. The packaging method comprises:

301: providing a display substrate comprising a base substrate and a display component formed on the base substrate.

In an embodiment of the present disclosure, the base substrate may be a glass substrate, on which a display component is formed. the display component may comprise an anode layer, a cathode layer, and an organic functional layer between the anode layer and the cathode layer. The organic functional layer generally comprises a hole transport functional layer, an emissive layer (emitting material layer, EML), and an electron transport functional layer. Each functional layer may be a layer or a composite layer of more than one layer. For example, the hole transport functional layer may be subdivided into a hole injection layer (HIL) and a hole transport layer (HTL); and the electron transport functional layer may be subdivided into an electron transport layer (ETL) and an electron injection layer (EIL). Of course, in addition to the above structures, the display component may be other structures, and this is not specifically limited in the embodiment of the present disclosure.

302: preparing a packaging cover plate, comprising forming an air cushion layer and a packaging layer having a first concave structure on the cover plate substrate, in which the air cushion layer is arranged proximate to the cover plate substrate, and the packaging layer covers the air cushion layer.

In an embodiment of the present disclosure, an air cushion layer may be formed on the cover plate substrate, and then a packaging layer covering the air cushion layer and having the first concave structure may be formed. Further, the packaging layer may comprise a barrier layer and a spacer layer, with the barrier layer being arranged proximate to the air cushion layer.

When the packaging layer comprises the barrier layer and the spacer layer, the forming the air cushion layer and the packaging layer having the first concave structure on the cover plate substrate comprises the following (1) to (3).

(1): arranging an air cushion layer mold having a fifth concave structure on the cover plate substrate in a chamber filled with a preset gas, to form an air cushion layer having a second concave structure between the cover plate substrate and the air cushion layer mold, in which an opening of the second concave structure faces away from the cover plate substrate.

Figure 4:
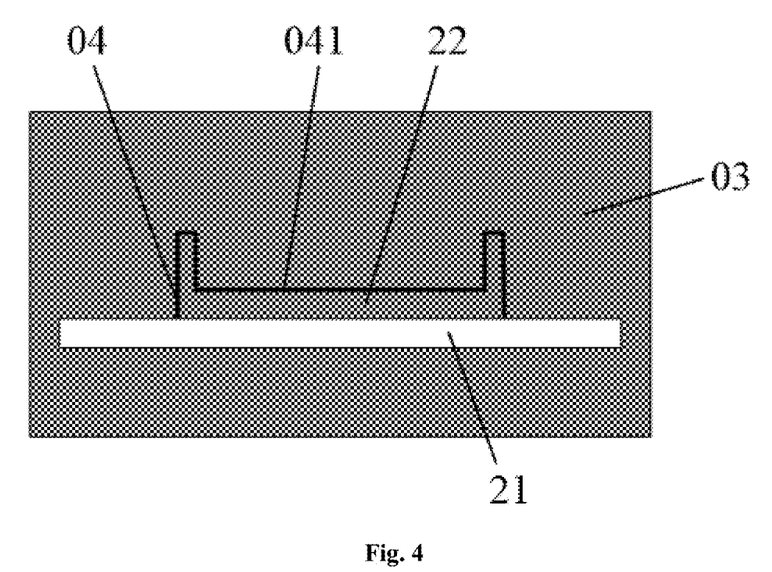
FIG. 4 is a schematic diagram showing a preparation of an air cushion layer according to some embodiments of the present disclosure.

Referring to FIG. 4, the air cushion layer 22 can be prepared in a chamber filled with a preset gas 03, in which the preset gas 03 can be a protection gas and/or a drying gas, such as a nitrogen gas, an inert gas or the like. An air cushion layer mold 04 having a fifth concave structure 041 may be bonded to the cover plate substrate 21 in a chamber filled with the preset gas 03, so that the preset gas 03 is filled between the air-cushion mold 04 and the cover plate substrate 21, that is, the material of the air cushion layer 22 is the preset gas 03. The air cushion layer 22 is surrounded by the air cushion layer mold 04, to form a second concave structure 221, an opening of which faces away from the cover plate substrate 21. In practical applications, the air cushion layer mold may be a cardboard mold, which may remain in the packaging cover plate after the packaging cover plate is prepared.

In practical applications, the air cushion layer may be formed by the above (1). The air cushion layer may be formed by a method similar to vacuum casting, or by forming soft plastics into a shape of the air cushion layer mold in a chamber filled with a preset gas, and curing it to function as the air cushion layer mold. Of course, other methods may be used to form the air cushion layer, and this is not specifically limited in the embodiment of the present disclosure.

(2): forming the barrier layer to cover the air cushion layer mold, wherein the barrier layer has a third concave structure and a fourth concave structure surrounding the third concave structure, with an opening direction of the fourth concave structure being opposite to an opening direction of the second concave structure, and with a convex edge of the second concave structure being embedded into the fourth concave structure.

Figure 5:
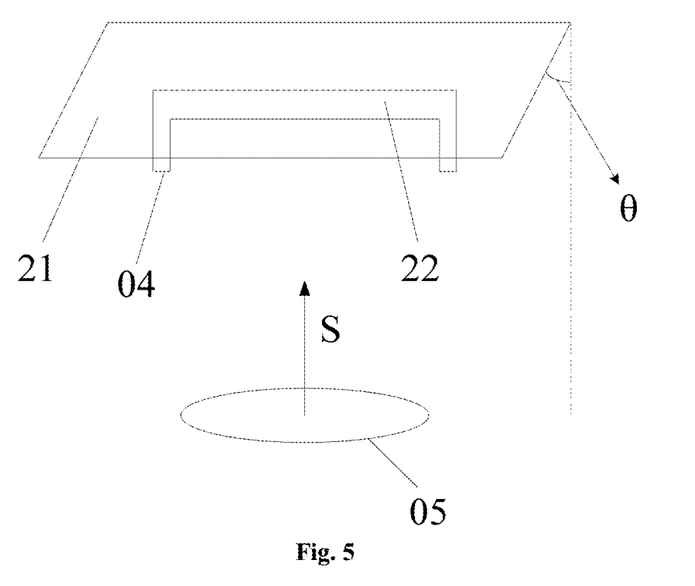
FIG. 5 shows a schematic view showing a preparation of a barrier layer from a viewing angle according to some embodiments of the present disclosure.
Figure 6:
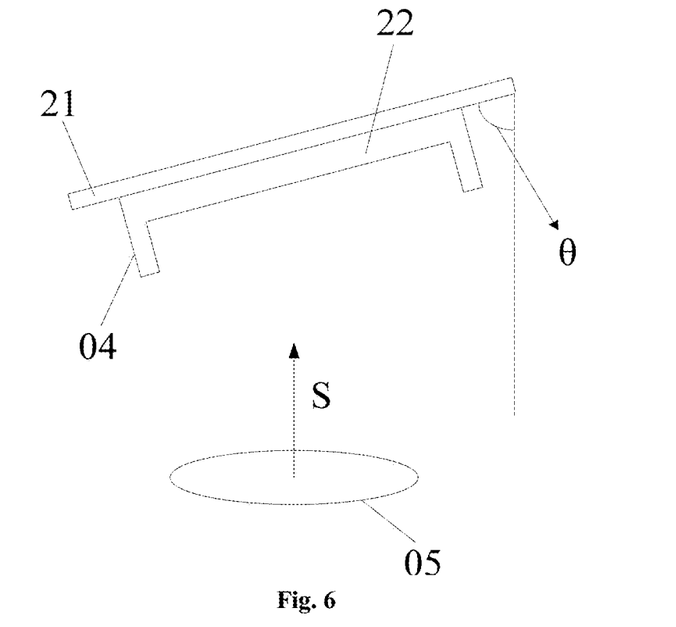
FIG. 6 shows a schematic view showing a preparation of a barrier layer from another viewing angle according to some embodiments of the present disclosure.

In a specific application, the barrier layer may be formed by an evaporation process or a sputtering process, with an acute angle formed between the cover plate substrate and an emission direction of an evaporation source or a sputtering source. FIGS. 5 and 6 are schematic views showing a preparation of a barrier layer from different viewing angles. Referring to FIGS. 5 and 6, the cover plate substrate 21 bonded with the air cushion layer mold 04 may be arranged at an acute angle θ with the emission direction S of the evaporation source or the sputtering source 05. For example, the acute angle θ is from 80 degrees to 87 degrees. Then, the evaporation source or the sputtering source 05 is turned on for evaporation or sputtering. During the evaporation process or the sputtering process, the cover plate substrate 21 is rotated is a certain rate, so that a barrier layer covering the air cushion layer mold 04 can be formed.

When the barrier layer is formed by an evaporation process or a sputtering process, if the cover plate substrate is arranged perpendicular to the emission direction of the evaporation source or the sputtering source, the thickness of the barrier layer at the center position may be relatively large with respect to the peripheral position. The uniformity in the thickness of the barrier layer can be improved by forming an acute angle close to 90 degrees between the cover plate substrate and the emission direction of the evaporation source or the sputtering source. In addition, by forming an acute angle close to 90 degrees rather than a right angle of 90 degrees between the cover plate substrate and the emission direction of the evaporation source or the sputtering source, the gravity action of the air cushion layer mold can be reduced to prevent the air cushion layer mold from falling down during the evaporation process or the sputtering process.

The barrier layer completely covers the air cushion layer in accordance with the shape of the air cushion layer mold, and therefore, the barrier layer has a third concave structure that matches the second concave structure and a fourth concave structure that reversely surrounds the convex edge of the second concave structure.

(3): forming the spacer layer having the first concave structure in the third concave structure.

In a specific application, a spacer layer having a first concave structure may be further formed in the third concave structure of the barrier layer by an evaporation process or a sputtering process.

It should be noted that, in the embodiment of the present disclosure, the sequence of preparation of the display substrate and the packaging cover plate is not specifically limited. That is, in a specific application, the operation of 301 may be performed before the operation of 302 or after the existence of 302, or 301 and 302 can be performed simultaneously.

303: sealing a contact portion between the packaging layer and the cover plate substrate.

In a specific application, the contact portion between the packaging layer and the cover plate substrate can be sealed by the following two sealing manners.

The first sealing manner: forming a sealant frame on the cover plate substrate on the periphery of the packaging layer.

In the first sealing manner, the material of the seal frame may comprise a thermosetting adhesive or a UV-curable adhesive, in which the thermosetting adhesive is liquid at normal temperature and can become solid after the heat curing, and the UV-curable adhesive is liquid at normal temperature and can become solid after the UV curing. The sealant frame can prevent external water and oxygen from entering the interior of the display panel and reacting with the display component.

The second sealing manner: sintering a contact portion between the packaging layer and the cover plate substrate.

In the second sealing manner, the contact portion between the packaging layer and the cover plate substrate may be sintered, so that the packaging layer may be sintered and fixed to the cover plate substrate. In a specific application, the packaging layer may be sintered and fixed to the cover plate substrate by a laser sintering process. By sintering the contact portion between the packaging layer and the cover plate substrate, it is capable of preventing the external water and oxygen from entering the interior of the display panel and reacting with the display component.

304: oppositely arranging the display substrate and the packaging cover plate to form a cell, such that the display component is embedded in the first concave structure.

Figure 7:
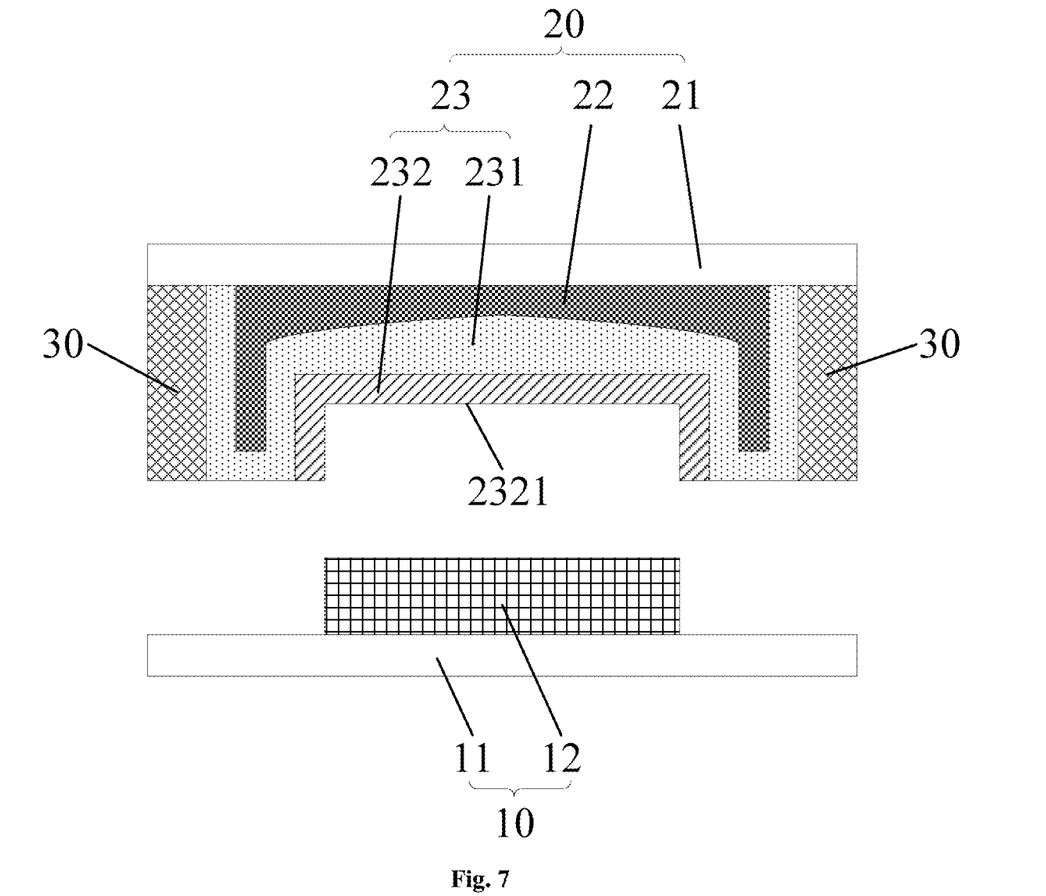
FIG. 7 shows a schematic view showing a display substrate and a packaging cover plate that are oppositely arranged to form a cell according to some embodiments of the present disclosure.
Figure 8:
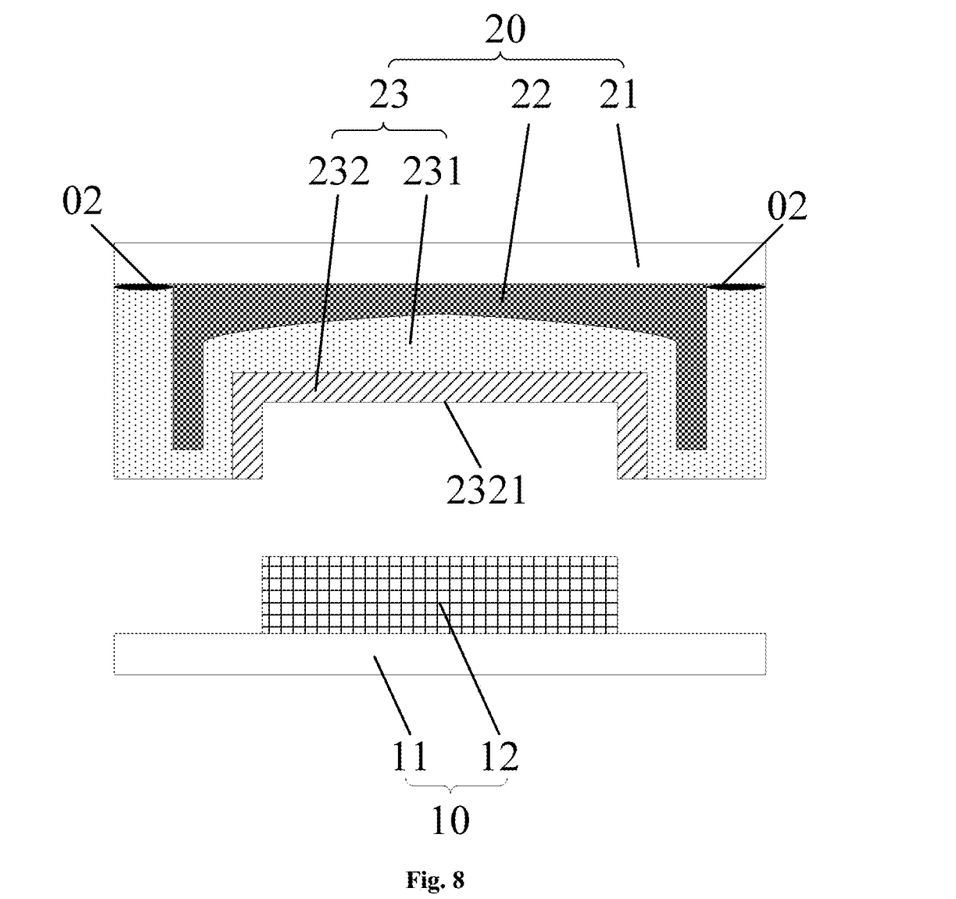
FIG. 8 shows a schematic view showing a display substrate and another packaging cover plate that are oppositely arranged to form a cell according to some embodiments of the present disclosure.
Figure 9:
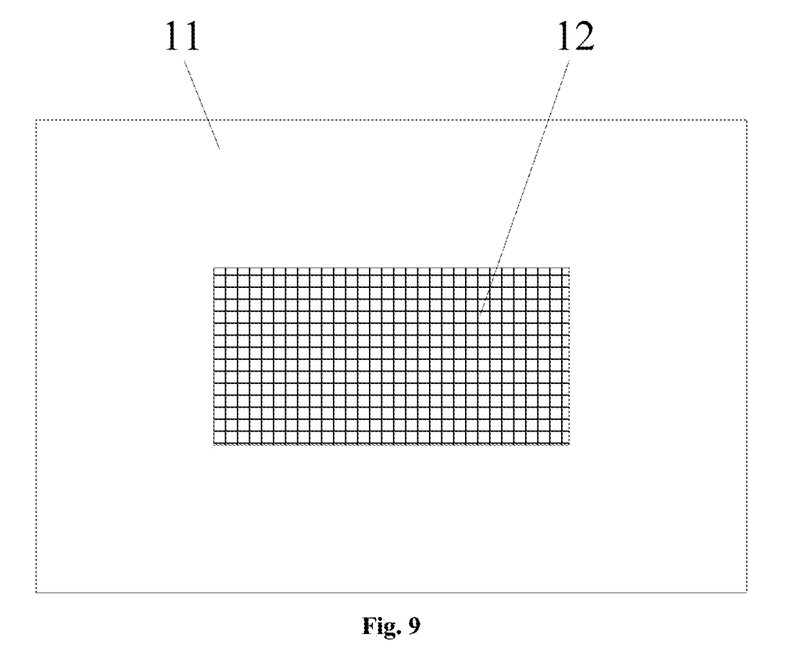
FIG. 9 is a top cross-sectional schematic view showing a display substrate according to some embodiments of the present disclosure.
Figure 10:
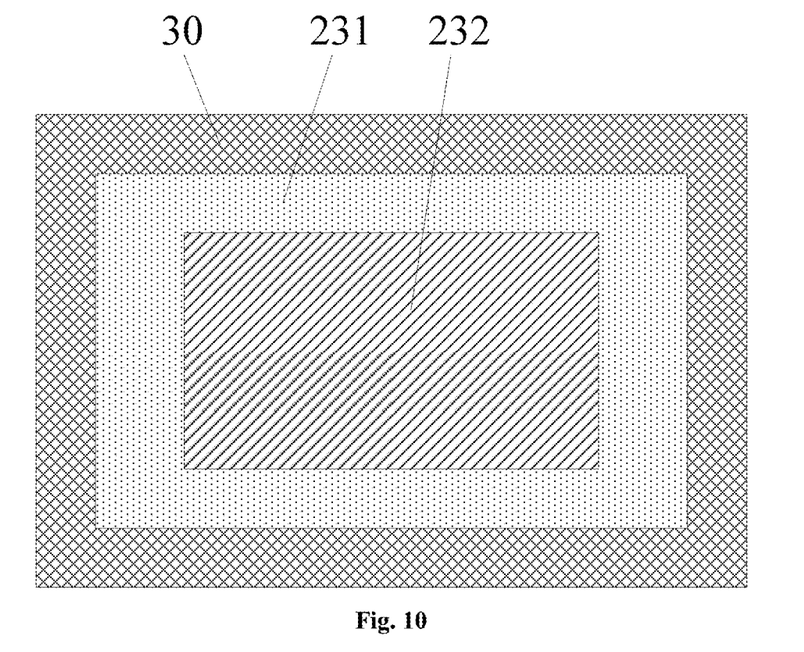
FIG. 10 is a top cross-sectional schematic view showing a packaging cover plate according to some embodiments of the present disclosure.
Figure 11:
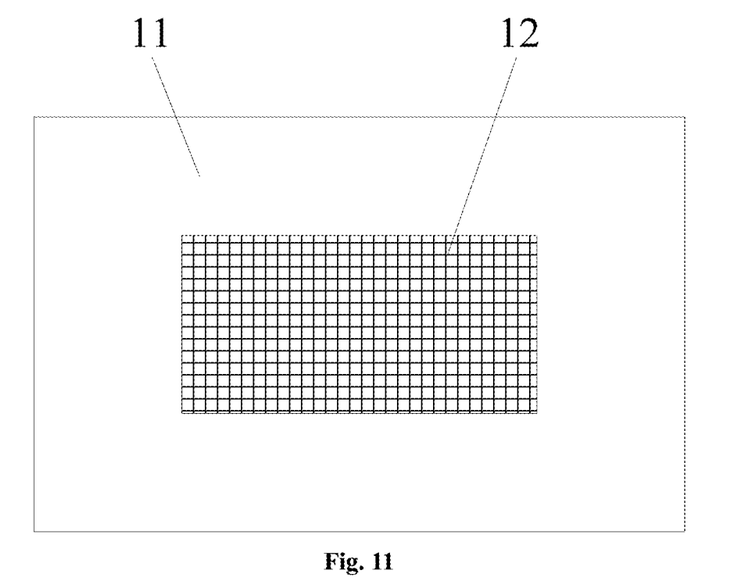
FIG. 11 is a top cross-sectional schematic view showing another display substrate according to some embodiments of the present disclosure.
Figure 12:
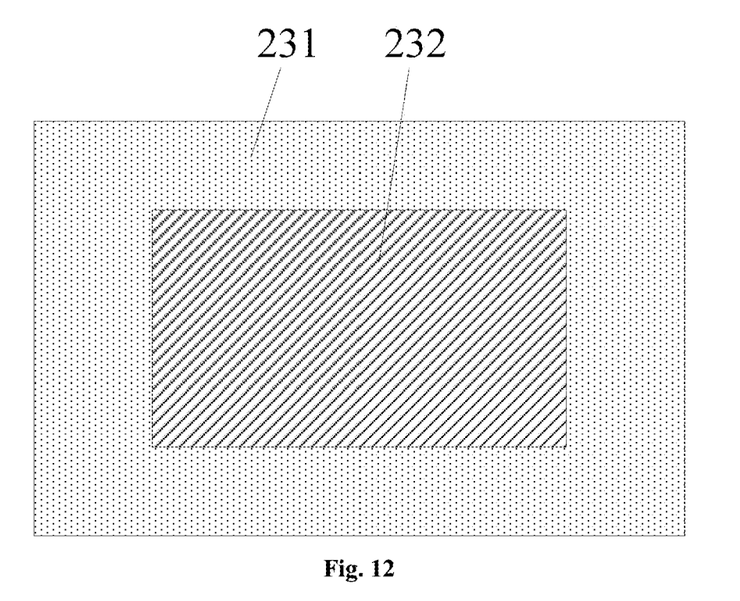
FIG. 12 is a top cross-sectional schematic view showing another packaging cover plate according to some embodiments of the present disclosure.

FIGS. 7 and 8 are schematic views showing the cell alignment between the display substrate and the packaging cover plate of different structures. Referring to FIG. 7, by a cell alignment, the display substrate 10 shown in FIG. 9 and the packaging cover plate 20 provided with the sealant frame 30 shown in FIG. 10 can be oppositely arranged to form a cell, such that the display component 12 is embedded in the first concave structure 2321 of the spacer layer 232. Referring to FIG. 8, by a cell alignment, the display substrate 10 shown in FIG. 11 and the packaging cover plate 20 not provided with the sealant frame shown in FIG. 12 can be oppositely arranged to form a cell, such that the display component 12 is embedded in the first concave structure 2321 of the spacer layer 232.

Further, after the display substrate and the packaging cover plate are oppositely arranged to form a cell, the packaging layer may be sintered to the base substrate on the periphery of the display component, and the packaging layer may be connected and fixed to the base substrate on the periphery of the display component by a laser sintering process. In a specific application, the barrier layer can be laser-sintered to the base substrate on the periphery of the display component, that is, the barrier layer in the packaging layer is laser-sintered to the base substrate, and the spacer layer in the packaging layer is not laser-sintered to the base substrate. As such, it is capable of further reducing the sintering area of the display panel, thereby reducing the amounts of heat and of water and oxygen released during the packaging process of the panel. Of course, in practical applications, the spacer layer can also be sintered to the base substrate on the periphery of the display component, and this is not specifically limited in the embodiment of the present disclosure. As compared with the reduced sintering area due to arranging the air cushion layer, the increased sintering area due to sintering the spacer layer is very small.

In addition, as for the display panel provided with the sealant frame, after the cell alignment, the contact portion between the sealant frame and the base substrate is further fixed by adding some thermosetting adhesives or UV-curable adhesives, so that the sealant frame can be connected not only to the cover plate substrate on the periphery of the packaging layer, but also but also to the base substrate on the periphery of the packaging layer, to achieve a better packaging effect.

In an embodiment of the present disclosure, a display substrate comprising a base substrate and a display component formed on the base substrate may be first provided; then a packaging cover plate may be prepared, comprising forming an air cushion layer and an packaging layer having a first concave structure on the cover plate substrate, in which the air cushion layer is arranged proximate to the cover plate substrate, and the packaging layer covers the air cushion layer; later a contact portion between the packaging layer and the cover plate substrate may be sealed; and further the display substrate and the packaging cover plate are oppositely arranged to form a cell, such that the display component is embedded in the first concave structure. In an embodiment of the present disclosure, an air cushion layer may be formed between the cover plate substrate and the packaging layer, the air cushion layer can block most of the packaging layer from the cover plate substrate, and reduce the contact area between the packaging layer and the cover plate substrate, and thus it is not necessary to sinter and fix the contact portion between the air cushion layer and the cover plate substrate. As such, it is possible to reduce the sintering area of the display device, thereby reducing the amounts of heat and of water and oxygen released during the packaging process, and reducing the adverse effect of the sintering process on the display component.

Embodiment 3

An embodiment of the present disclosure further provides a display device comprising the above display panel.

In an embodiment of the present disclosure, a packaging cover plate of a display device comprises a cover plate substrate, an air cushion layer formed on the cover plate substrate, and a packaging layer covering the air cushion layer and having a first concave structure; and a display substrate of a display device comprises a base substrate and a display component formed on the base substrate and embedded in the first concave structure. In the embodiment of the present disclosure, the air cushion layer can block most of the packaging layer from the cover plate substrate, and reduce the contact area between the packaging layer and the cover plate substrate, and thus it is not necessary to sinter and fix the contact portion between the air cushion layer and the cover plate substrate. As such, it is capable of reducing the sintering area of the display device, thereby reducing the amounts of heat and of water and oxygen released during the packaging process, and reducing the adverse effect of the sintering process on the display device.

For the foregoing method embodiments, in order to simplify the description, they are all expressed as a series of action combinations. However, a person skilled in the art should understand that the embodiments of the present disclosure are not limited by the described sequence of actions, because some steps may be performed in other orders or simultaneously according to embodiments of the present disclosure. Then, a person skilled in the art should also understand that the embodiments described in the description all belong to preferred embodiments, and the actions and modules involved are not necessarily required by the embodiments of the present disclosure.

Each embodiment in the present description is described in a progressive manner, and each embodiment focuses on differences from other embodiments, and the same or similar parts between the various embodiments can be referred to each other.

Finally, it should also be noted that in the present invention, relational terms such as first and second, etc. are only used to distinguish one entity or operation from another entity or operation, and do not necessarily requiring or implying that there is an actual relationship or order between the entities or operations. Moreover, the terms "comprise", "comprising" or any other variation thereof is intended to cover a non-exclusive inclusion, such that a process, a method, an article, or a device comprising a series of elements comprises not only those elements, but also those not explicitly listed, or comprises the elements inherent to such process, such method, such article, or such device. In the case of no more limitation, the element defined by the sentence "comprise/comprising a/an . . . " does not exclude that there are other same elements in the process, the method, the article, or the device comprising the element.

The display panel, the method for preparing the same and the display device provided by the present disclosure are described in detail. The principles and implementations of the present disclosure are described by using specific examples. The description of the above Examples is merely used for helping to understand the method according to the present disclosure and its core idea. Meanwhile, according to the spirit of the present disclosure, a person skilled in the art may make amendments within the range of the detailed description and the application thereof. To sum up, the content of the specification should not be construed as limiting the present disclosure.

What is claimed is:

1. A method for packaging a display panel, comprising:
providing a display substrate comprising a base substrate and a display component formed on the base substrate;
preparing a packaging cover plate, comprising forming an air cushion layer and a packaging layer having a first concave structure on a cover plate substrate, wherein the air cushion layer is arranged proximate to the cover plate substrate, and the packaging layer covers the air cushion layer;
sealing a contact portion between the packaging layer and the cover plate substrate; and
oppositely arranging the display substrate and the packaging cover plate to form a cell, such that the display component is embedded in the first concave structure, wherein the packaging layer comprises a barrier layer and a spacer layer, and the forming the air cushion layer and the packaging layer having the first concave structure on the cover plate substrate comprises:
arranging an air cushion layer mold having a fifth concave structure on the cover plate substrate in a chamber filled with a preset gas, to form an air cushion layer having a second concave structure, an opening of which faces away from the cover plate substrate between the cover plate substrate and the air cushion layer mold;
forming the barrier layer to cover the air cushion layer mold, wherein the barrier layer has a third concave structure and a fourth concave structure surrounding the third concave structure, with an opening direction of the fourth concave structure being opposite to an opening direction of the second concave structure, and with a convex edge of the second concave structure being embedded into the fourth concave structure; and
forming the spacer layer having the first concave structure in the third concave structure.

2. The method of claim 1, wherein the sealing the contact portion between the packaging layer and the cover plate substrate comprises:
sintering the contact portion between the packaging layer and the cover plate substrate; or
forming a sealant frame on the cover plate substrate on the periphery of the packaging layer.

3. The method of claim 1, wherein the air cushion layer mold is a cardboard mold, which remains in the packaging cover plate after the packaging cover plate is prepared; or the air cushion layer mold is prepared by forming soft plastics into a shape of the air cushion layer mold in a chamber filled with a preset gas, followed by curing.

4. The method of claim 1 wherein the air cushion layer is formed by vacuum casting.

5. The method of claim 1, wherein after the arranging the display substrate and the packaging cover plate to form the cell, such that the display component is embedded in the first concave structure, the method further comprises:
sintering the packaging layer and the base substrate on the periphery of the display component.

6. The method of claim 5, wherein the packaging layer comprises a barrier layer and a spacer layer, and the sintering the packaging layer and the base substrate on the periphery of the display component comprises:
sintering the barrier layer and the base substrate on the periphery of the display component.

7. The method of claim 1, wherein after the cell is formed, a thermosetting adhesive or a UV-curable adhesive is further added to a contact portion between the sealant frame and the base substrate to fix them, such that the sealing frame on the periphery of the sealing layer and the base substrate are connected.

* * * * *